United States Patent
Kirn

(10) Patent No.: US 6,535,058 B1
(45) Date of Patent: Mar. 18, 2003

(54) MULTI-REFERENCE, HIGH-ACCURACY SWITCHING AMPLIFIER

(75) Inventor: Larry Kirn, West Bloomfield, MI (US)

(73) Assignee: JAM Technologies, LLC, Boston, MA (US)

( * ) Notice: Subject to any disclaimer, the term of this patent is extended or adjusted under 35 U.S.C. 154(b) by 0 days.

(21) Appl. No.: 09/831,595

(22) PCT Filed: Nov. 12, 1999

(86) PCT No.: PCT/US99/26691

§ 371 (c)(1),
(2), (4) Date: May 11, 2001

(87) PCT Pub. No.: WO00/28658

PCT Pub. Date: May 18, 2000

Related U.S. Application Data

(60) Provisional application No. 60/107,948, filed on Nov. 12, 1998.

(51) Int. Cl.$^7$ .................. H03F 3/38; H03F 3/217; H03H 7/00
(52) U.S. Cl. ............. 330/10; 330/207 A; 330/251; 333/167
(58) Field of Search ................ 330/207 A, 251, 330/10; 333/167

(56) References Cited

U.S. PATENT DOCUMENTS

| | | | |
|---|---|---|---|
| 4,404,526 A | 9/1983 | Kirn | 330/10 |
| 4,773,096 A | 9/1988 | Kirn | 381/120 |
| 5,309,297 A | 5/1994 | Funahashi | 360/67 |
| 5,398,003 A | 3/1995 | Heyl et al. | 330/10 |
| 5,610,553 A | 3/1997 | Kirn | 330/10 |
| 5,613,010 A | 3/1997 | Heyl et al. | 381/117 |
| 5,617,058 A * | 4/1997 | Adrian et al. | 330/10 |
| 5,777,512 A * | 7/1998 | Tripathi et al. | 330/207 A |
| 5,886,572 A | 3/1999 | Myers et al. | 330/10 |
| 5,909,153 A | 6/1999 | Delano et al. | 332/107 |
| 5,909,496 A | 6/1999 | Kishigami et al. | 381/111 |
| 5,949,282 A | 9/1999 | Nguyen et al. | 330/10 |
| 6,150,880 A | 11/2000 | Schweighofer | 330/207 A |
| 6,281,767 B1 * | 8/2001 | Lastrucci | 333/167 |
| 6,441,685 B1 * | 8/2002 | MacMillan | 330/10 |

* cited by examiner

*Primary Examiner*—Patricia Nguyen
(74) *Attorney, Agent, or Firm*—Gifford, Krass, Groh, Sprinkle, Anderson & Citkowski, PC

(57) ABSTRACT

A switching amplifier employs a plurality of independent output stages in a bridged configuration, with each output stage presenting the product of an independent duty cycle and two or more static of dynamic reference voltages, currents or powers to a single terminal of a common output load. A plurality of electrically controlled switches (207, 208, 209, 210, 211, 212) interconnect the references to the load (218), with a waveform generator (220) controlling the switches for a coarse and fine control of power to the load. The waveform generator preferably uses pulse-code modulation (PCM), though the invention is not limited in this regard, and is applicable to any modulation scheme or waveform suitable to sequence the electrically controlled switches. The load is preferably filtered on either side, and return paths for the power supplies (i.e., ground) are connected through separate switches to the load through the filters (213, 214, 215, 216, 217). The amplifier may be used for audio or other applications benefitting from the design.

18 Claims, 2 Drawing Sheets

MULTI-REFERENCE, HIGH-ACCURACY SWITCHING AMPLIFIER

This Application is a 371 of PCT/US99/2691 filed Nov. 12, 1999 which claims benefit of Prov. No. 60/107,948 filed Nov. 12, 1998.

FIELD OF THE INVENTION

This invention relates generally to switching amplifiers and, in particular, to a switching amplifier which uses a plurality of independently referenced output stages in a bridged configuration for greater accuracy at reduced cost.

BACKGROUND OF THE INVENTION

Switching amplifiers have historically relied upon the principle of modulating connection time within a fixed control period between a unipolar or bipolar power supply reference and the load. The voltage or current available to the load is essentially that of the connected power supply multiplied by the connection duty cycle (ratio of ON time to total time). An output voltage, current, or power is thus controlled in a proportional fashion by a modulating input, which is updated as frequently as once per control period. The control period typically uses ranges from 1/20th to 1/2 the period of the highest frequency of interest.

The outputs of switching amplifiers are filtered before application to the load. This reduces heterodyne products between the modulating source and the control period (aliasing). Use of shorter control periods allows use of lower-Q output filters, whereas longer control periods mandate sharp filter slopes. Filter costs therefore encourage the use of shorter control periods.

In the past decade, the dynamic range of sources for amplification has increased dramatically. A typical digital audio source now has a dynamic range of 96 dB and a bandwidth of 20 kHz. In order to accurately amplify such a signal, a typical switching amplifier output stage then requires maximum timing resolution of roughly one part in 65,000 within a 40 kHz control frequency, a resolution substantially less than one nanosecond.

FIG. 1 shows a typical prior-art bridge switching amplifier output stage using a single reference for both output drivers. FIG. 2 shows the timing requirements of the amplifier output stage, wherein waveforms 202–205 correspond to the (active-high) drives applied to the electrically controlled switches 102–105 in FIG. 1. Power supply 101 is connected to switches 102 and 104 in order to control voltage to the load 108 through either filter 106 or 107. The return path of power supply 101 is connected to switches 103 and 105 in order to complete the path.

Control of switches 102 through 105 is effectuated by control circuit 109. Filters 106 and 107 serve to remove switching components from the output. Switches 102 and 103 are activated exclusively with a specific duty cycle, while switch 105 is activated to provide one polarity to the load 108, via filters 106 and 107. Alternatively, switches 104 and 105 are activated exclusively with a specific duty cycle, while switch 103 is activated to provide an opposite polarity to the load 108 through filters 106 and 107.

In the event that the output stage of FIG. 1 is operated at a typical rate of 100 kHz, the time resolution to accurately amplify a signal with 96 dB dynamic range (one part in 65536) is seen to be the reciprocal of 100 kHz divided by 65536, or 153 picoseconds. This is beyond the capability of common-available silicon semiconductors. A different approach is indicated in order to accurately amplify high-bandwidth, high-accuracy signals at reasonable cost.

SUMMARY OF THE INVENTION

This invention resides in a switching amplifier incorporating a plurality of independent output stages in a bridged configuration. Broadly, each output stage presents the product of an independent duty cycle and two or more static or dynamic reference voltages, currents, or powers to a single terminal of a common output load. The configuration achieves higher accuracy at lower cost than conventional designs by utilizing multiple references to produce an output voltage, current, or power with relaxed timing requirements.

In the preferred embodiment, first and second voltage references are used, with the voltage of the first reference being higher than the voltage of the second reference. The first voltage reference is higher than the second voltage reference by a factor that is a power of two. A plurality of electrically controlled switches interconnect the references to the load, and waveform generator controls the switches in a manner whereby the first voltage is applied for a coarse control of power to the load and the second voltage is applied for a fine control of power to the load. The waveform generator preferably uses pulse-code modulation (PCM), though the invention is not limited in this regard, and is applicable to any modulation scheme or waveform suitable to sequence the electrically controlled switches.

The load is preferably filtered on either side, and returns paths for the power supplies are connected through separate switches connected to the load as filtered. In an embodiment utilizing two references, a system according to the invention preferably includes a first pair of electrically controlled switches used to connect one reference to each side of the load in series, a second pair of electrically controlled switches used to connect the other reference to each side of the load in series, and a third pair of electrically controlled switches, one on either side of the load for return-path purposes. The waveform generator in this case includes sufficient outputs to control each switch as appropriate.

DETAILED DESCRIPTION OF THE INVENTION

This invention broadly resides in a switching amplifier incorporating two independent output stages in a bridged configuration. Each output stage presents the product of an independent duty cycle and two or more static or dynamic reference voltages, currents, or powers to a single terminal of a common output load. The configuration achieves higher accuracy at lower cost than conventional designs by utilizing multiple references to produce an output voltage, current, or power with relaxed timing requirements.

By way of an introduction, the load is connected in a bridge configuration across two (or more) independent switching amplifier output stages so as to receive the difference of their outputs; that is, the difference between two independent referenced/duty cycle products. As with existing switching amplifiers, wherein the independent duty cycle of a single reference is used for each output stage of the bridge, timing resolution limitations impact low-level modulation.

In that each output stage yields a product, it can be seen that reduction of a reference mandates an increase in duty cycle to maintain the same output. It can also be seen that reduction of a reference by any factor without commensurate duty cycle increase reduces the output of that stage by that factor.

In that the ultimate output to the load of a bridged configuration is a difference signal, it can be seen that the two output stages need not yield the same weight, or reference/duty cycle product. Coarse information of a high reference can be summed at the load with fine information of a lower reference. Separation of coarse information from fine in a digital data stream is simply a matter of bit field selection. Analog separation is possible using differentiators.

In order to accommodate a wide dynamic range, each reference may itself be dynamic. Amplification resolution requirements are often a function of current level, as opposed to a fixed absolute. Use of dynamic references allows resolution to follow level. For example, with dynamic references, the energy applied to the load may be varied in accordance with the instantaneous value of the incoming signal, as described in U.S. Pat. No. 5,610,553, which is incorporated herein in its entirety by reference.

By using independent references and control duty cycles for a single load, it is therefore possible to alter timing resolution requirements from those of a single switching amplifier output stage. Note that any reference changes are made appropriate to the instantaneous levels at hand in order to increase the dynamic range, and are not made solely to effect output attenuation.

Figure 1:
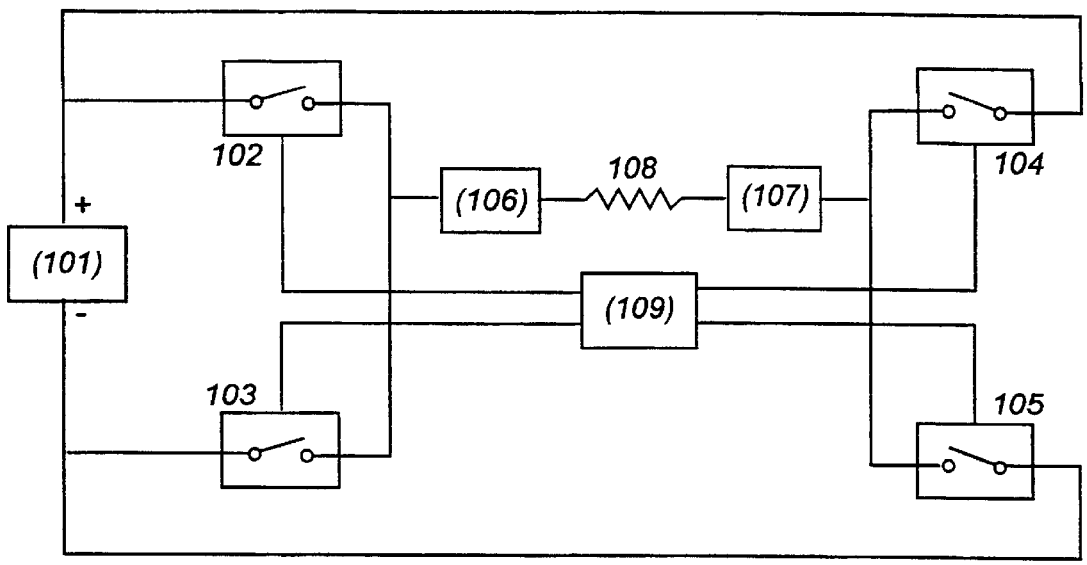
FIG. 1 shows a typical bridge switching amplifier output stage using a single reference for both output drivers.
Figure 2:
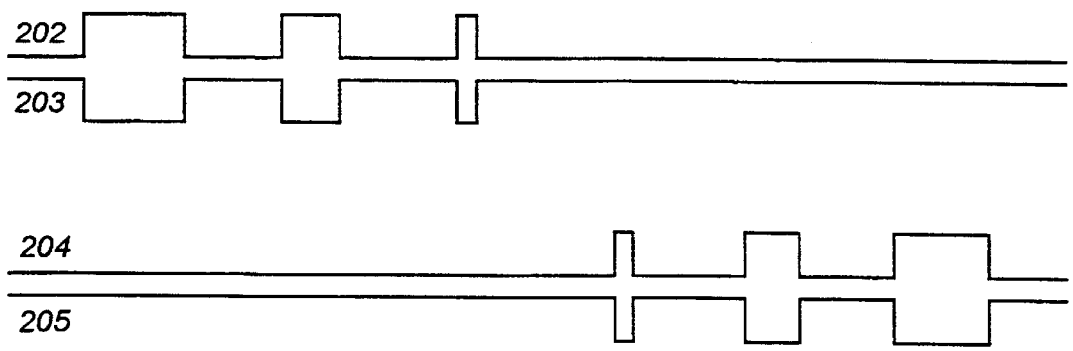
FIG. 2 shows the timing requirements of a typical bridged switching amplifier output stage.
Figure 3:
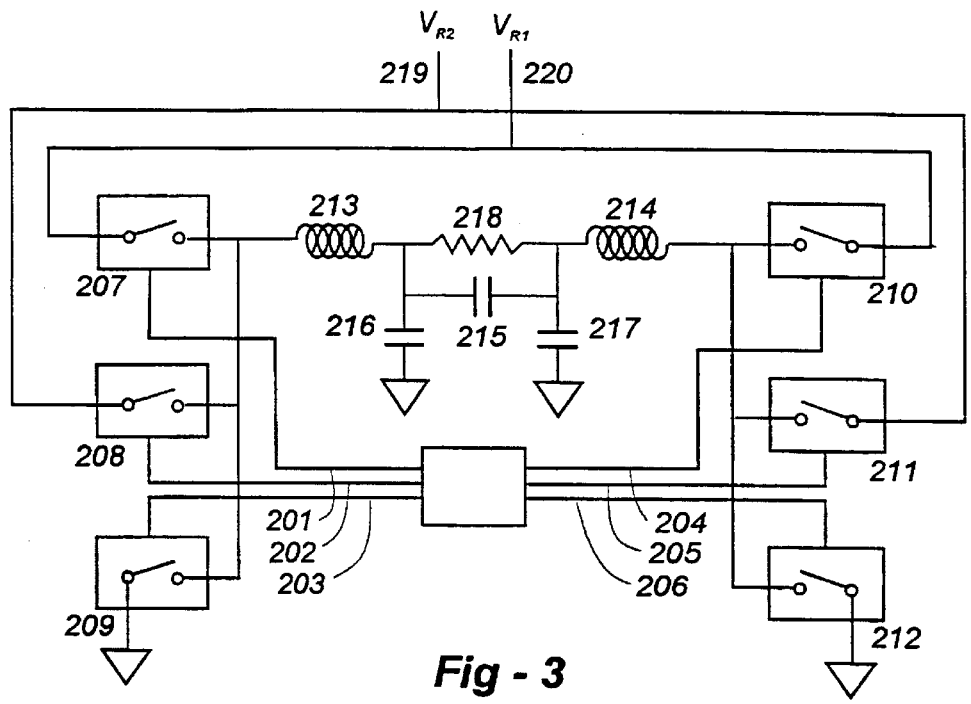
FIG. 3 shows a preferred embodiment of the invention with two dynamic references per output driver.
Figure 4:
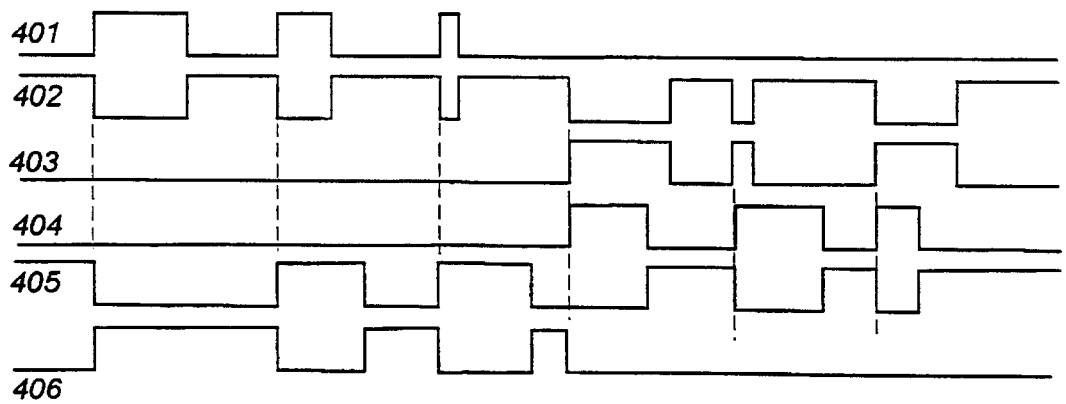
FIG. 4 shows the timing requirements of the preferred embodiment illustrated in FIG. 3.

FIG. 3 is a diagram which illustrates a preferred embodiment of the invention incorporating two dynamic references per output driver. FIG. 4 shows timing waveforms associated with the system. A first reference, VR1, is connected to switches 207 and 210 to provide energy to the load 218 through the filters on either side of the load utilizing the capacitors and inductors shown in the diagram. A second reference, VR2, supplies energy to the load 218 through the filters on either side of the load and control of the switches 208 and 211. Returns paths for the power supplies are connected through switches 209 and 212. Control of the switches is carried out by a control circuit 220, the timing diagrams for which are shown in FIG. 4. The switches may be implemented using commercially available power MOSFETs or any other suitable device.

Reference VR1 is preferably higher than VR2 by a factor that is a power of two, in order to allow direct bit field extraction for the coarse/fine control. Depending upon output polarity, simultaneous switch pairs controlled are either 207/208 (coarse) with 208/209 (fine), or 210/211 (coarse) with 212/211 (fine). Control in this fashion makes VR2 a "pseudo-ground," with sinking and sourcing on opposite sides. Instantaneous differences in duty cycles are not seen by the load, in that they are substantially higher in frequency than the output filter will permit.

Signals 401–406 reflect the control signals provided through nodes 201–206. The modulation starts with decreasing coarse and fine values, then reverses sign to a coarse increase with fine decrease, followed by a coarse decrease with fine increase. Note that the numerator (active) signals are shown activated before their complements. This is done for convenience to show bit sense reversal across the differential (a "one" means sourcing on one side, but sinking on the other).

In the event that the output stage of the amplifier just described is operated at a rate of 100 kHz, for example, the timing resolution of the duty cycle required to accurately amplify a signal with 96 dB dynamic range may be derived through the reciprocal of 100 kHz, divided by 65536 and multiplied by 50, resulting in 8 nanoseconds (assuming the references exhibit the same 50:1 ratio). This is well within the capability of commercially available semiconductor devices.

I claim:

1. A switching amplifier, comprising:
    a load having first and second terminals;
    first and second references, with the magnitude of the first reference being higher than the magnitude of the second reference;
    a plurality of electrically controlled switches interconnecting the references to the load; and
    a waveform generator controlling the switches at a rate higher than the Nyquist frequency, whereby the first reference is applied for a coarse control of power to the first terminal of the load and the second reference is applied for a fine control of power to the second terminal of the load.

2. The switching amplifier of claim 1, further including a filter connected on either side of the load in series to which the switches are connected.

3. The switching amplifier of claim 1, wherein the references are voltage references.

4. The switching amplifier of claim 1, wherein the references are current references.

5. The switching amplifier of claim 1, wherein the references are power references.

6. The switching amplifier of claim 1, wherein the references are static.

7. The switching amplifier of claim 1, wherein the references are dynamic.

8. The switching amplifier of claim 1, wherein the first voltage reference is higher than the second voltage reference by a factor that is a power of two.

9. The switching amplifier of claim 1, further including an electrically controlled switch connected in series on either side of the load to ground.

10. A switching amplifier, comprising:
    a load with a filter connected in series on either side;
    a plurality of references, each of a different magnitude;
    a plurality of electrically controlled switches interconnecting each reference to the load through both filters;
    an input; and
    circuitry for converting the input into a plurality of pulse-code-modulated (PCM) signals which operate the switches for a coarse and fine control of energy on opposing sides of the load through the filters.

11. The switching amplifier of claim 10, wherein the references are voltage, current or power references.

12. The switching amplifier of claim 10, wherein the references are static.

13. The switching amplifier of claim 10, wherein the references are dynamic.

14. The switching amplifier of claim 10, wherein the first voltage reference is higher than the second voltage reference by a factor that is a power of two.

15. The switching amplifier of claim 10, further including an electrically controlled switch connected in series on either side of the load to ground.

16. A switching amplifier, comprising:

a filtered load, first and second voltage references, with the voltage of the first reference being higher than the voltage of the second reference;

a first pair of electrically controlled switches, one corrected to each side of the filtered load in series, with the other side of each switch being connected to the first voltage reference;

a second pair of electrically controlled switches, one connected to each side of the filtered load in series, with the other side of each switch being connected to the second voltage reference;

a third pair of electrically controlled switches, one connected to each side of the filtered load in series, with the other side of each switch forming a path to ground;

a waveform generator controlling each switch in accordance with a pulse-code-modulated input signal.

17. The switching amplifier of claim 16, wherein the input signal is an audio signal.

18. The switching amplifier of claim 16, wherein the waveform generator controls each switch in a manner whereby the first reference is applied for a coarse control of power to the load and the second reference is applied for a fine control of power to the load as a function of the modulated input signal.

* * * * *

UNITED STATES PATENT AND TRADEMARK OFFICE
CERTIFICATE OF CORRECTION

PATENT NO. : 6,535,058 B1
DATED : March 18, 2003
INVENTOR(S) : Kirn

It is certified that error appears in the above-identified patent and that said Letters Patent is hereby corrected as shown below:

Column 1,
Line 4, replace "PCT/US99/2691" with -- PCT/US99/26691 --.

Column 2,
Line 38, replace "retum-path" with -- return-path --.

Column 5,
Line 6, replace "corrected" with -- connected --.

Signed and Sealed this

Eleventh Day of May, 2004

JON W. DUDAS
*Acting Director of the United States Patent and Trademark Office*